United States Patent
Ishiguro et al.

(10) Patent No.: US 9,899,572 B2
(45) Date of Patent: Feb. 20, 2018

(54) SEMICONDUCTOR LIGHT-EMITTING DEVICE

(71) Applicant: TOYODA GOSEI CO., LTD., Kiyosu-shi (JP)

(72) Inventors: Yuya Ishiguro, Kiyosu (JP); Koichi Goshonoo, Kiyosu (JP); Naoki Arazoe, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/428,913

(22) Filed: Feb. 9, 2017

(65) Prior Publication Data

US 2017/0250314 A1    Aug. 31, 2017

(30) Foreign Application Priority Data

Feb. 29, 2016   (JP) .................... 2016-038456

(51) Int. Cl.
| | |
|---|---|
| H01L 33/40 | (2010.01) |
| H01L 33/46 | (2010.01) |
| H01L 33/38 | (2010.01) |
| H01L 33/42 | (2010.01) |

(52) U.S. Cl.
CPC .......... *H01L 33/405* (2013.01); *H01L 33/387* (2013.01); *H01L 33/42* (2013.01); *H01L 33/46* (2013.01); *H01L 33/382* (2013.01)

(58) Field of Classification Search
CPC ..... H01L 33/00–33/648; H01L 27/15–27/156; H01L 2933/00–2933/0091; H01L 51/50–51/56; H01L 51/0032–51/0095; H01L 27/32–27/3297

USPC ...... 257/98, 99, E33.072, E33.064, E33.066
See application file for complete search history.

(56) References Cited

U.S. PATENT DOCUMENTS

| | | | |
|---|---|---|---|
| 8,637,886 B2* | 1/2014 | Tsuji ................... | H01L 33/405 257/100 |
| 9,508,900 B2* | 11/2016 | Kamiya ................. | H01L 33/32 |
| 2011/0012154 A1* | 1/2011 | Okagawa ............... | H01L 33/22 257/98 |
| 2011/0018024 A1* | 1/2011 | Fukshima ............ | H01L 33/387 257/98 |

FOREIGN PATENT DOCUMENTS

JP    2012-164930 A    8/2012

* cited by examiner

*Primary Examiner* — Jonathan Han
(74) *Attorney, Agent, or Firm* — McGinn IP Law Group, PLLC

(57) ABSTRACT

The present techniques provide a semiconductor light-emitting device in which current diffusion is ensured in a transparent electrode and light absorption by the transparent electrode is suppressed. The light-emitting device comprises an n-type semiconductor layer, a light-emitting layer, a p-type semiconductor layer, a transparent electrode, a transparent insulating film, and a reflection electrode. The transparent electrode contains In. The thickness of the transparent electrode is 10 nm to 150 nm. The reflection electrode is a p-type electrode. The reflection electrode P1 has a plurality of contact electrodes being in contact with the transparent electrode at a plurality of openings. The number density of the contact electrodes is 400/mm$^2$ to 1,000/mm$^2$.

11 Claims, 6 Drawing Sheets

SEMICONDUCTOR LIGHT-EMITTING DEVICE

BACKGROUND OF THE INVENTION

Filed of the Invention

The present techniques relate to a semiconductor light-emitting device, and more specifically to a semiconductor light-emitting device having a reflection electrode.

BACKGROUND ART

In the technical field of semiconductor light-emitting device, there are techniques to diffuse current in a light-emitting surface to improve emission efficiency. For that purpose, a transparent electrode may be formed on a semiconductor layer. Current is diffused in a light emitting surface inside this transparent electrode.

Japanese Patent Application Laid-Open (kokai) No. 2012-164930 discloses a light-emitting device having a p-side transparent electrode 3 made of ZnMgO with a thickness of 1,000 Å to 100,000 Å, a reflection electrode 7, and a p-side pad electrode 8 (refer to paragraphs [0020] to [0021]). Thereby, the light-emitting device can reflect a light transmitting through the transparent electrode from a light-emitting part toward the light-emitting part (refer to paragraph [0006]).

The transparent electrode does not completely transmit light. The transparent electrode slightly absorbs light. Therefore, it is desirable that an optical path of the light passing through the transparent electrode is as short as possible. To shorten the optical path, the thickness of the transparent electrode is preferably reduced. However, when the thickness of the transparent electrode is reduced, current diffusion may not be sufficiently achieved in the transparent electrode.

SUMMARY OF THE INVENTION

The present techniques have been conceived for solve the aforementioned problems involved in conventional techniques. Thus, an object of the present techniques is to provide a semiconductor light-emitting device in which current diffusion is ensured in the transparent electrode and light absorption by the transparent electrode is suppressed.

In a first aspect of the present techniques, there is provided a semiconductor light-emitting device comprises a first conduction type first semiconductor layer, a second conduction type second semiconductor layer, a light-emitting layer disposed between the first semiconductor layer and the second semiconductor layer, a transparent electrode on the second semiconductor layer, an insulating film covering a part of the transparent electrode and having a plurality of openings, and a reflection electrode formed on the insulating film and being in contact with the transparent electrode through the plurality of openings. The transparent electrode contains In. The thickness of the transparent electrode is 10 nm to 150 nm. The reflection electrode is an electrode for supplying current to the second semiconductor layer. The reflection electrode has a plurality of contact electrodes being in contact with the transparent electrode through the plurality of openings. The number density of the contact electrodes is 400/mm$^2$ to 1,000/mm$^2$.

The semiconductor light-emitting device can diffuse current in the transparent electrode and suppress light absorption by the transparent electrode.

A second aspect of the techniques is directed to a specific embodiment of the semiconductor light-emitting device, wherein a ratio of a total area occupied by the plurality of contact electrodes to a total surface area of the transparent electrode is 1% to 5%.

A third aspect of the techniques is directed to a specific embodiment of the semiconductor light-emitting device, wherein the insulating film is a distributed Bragg reflection (DBR) film.

A fourth aspect of the techniques is directed to a specific embodiment of the semiconductor light-emitting device, wherein the reflection electrode comprises a transparent conductive film and a reflective metal layer formed on the transparent conductive film, the transparent conductive film being formed on the insulating film and being in contact with the transparent electrode through the plurality of openings.

A fifth aspect of the techniques is directed to a specific embodiment of the semiconductor light-emitting device, wherein the transparent electrode is an Indium Zinc Oxide (IZO) film. The reflection electrode comprises a transparent conductive film and a reflective metal layer formed on the transparent conductive film. The transparent conductive film is amorphous IZO (a-IZO) film which is formed on the insulating film and is in contact with the IZO film of the transparent electrode through the plurality of openings of the insulating film.

The present techniques, disclosed in the specification, provide a semiconductor light-emitting device wherein current diffusion is ensured in the transparent electrode and light absorption by the transparent electrode is suppressed.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
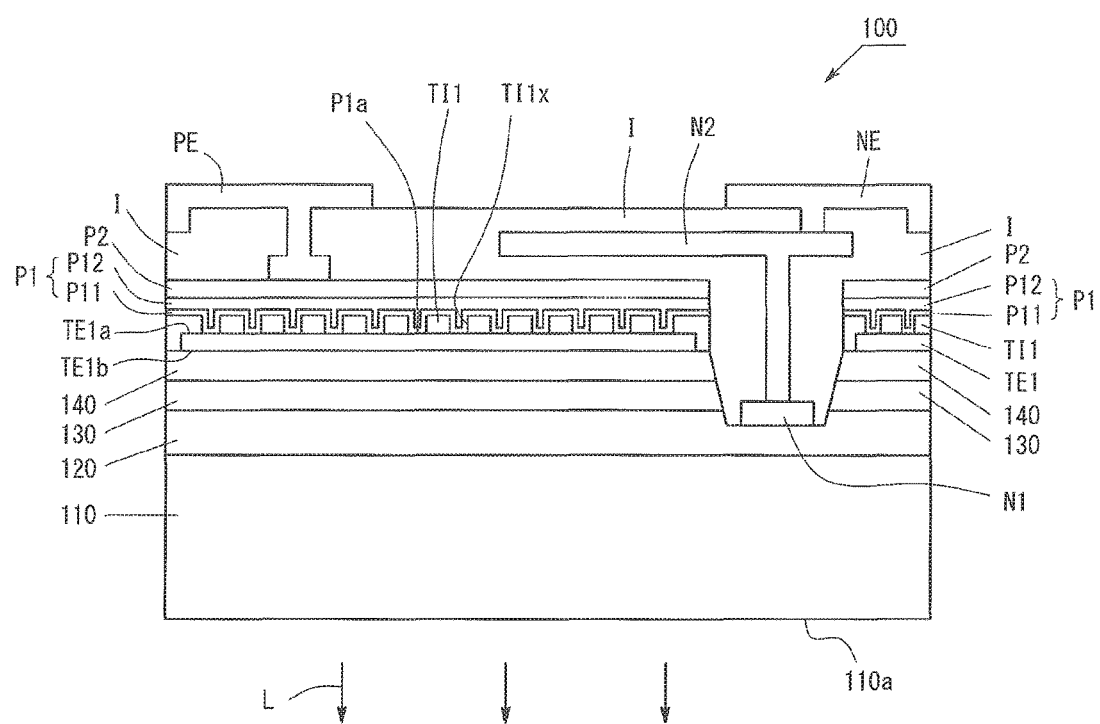
FIG. 1 is a schematic view of the structure of a light-emitting device according to an embodiment.

With reference to the drawings, specific embodiment of the semiconductor light-emitting device as an example will next be described in detail. However, these embodiments should not be construed as limiting the techniques thereto. The below-described depositing structure of the layers of the semiconductor light-emitting device and the electrode structure are given only for the illustration purpose, and other depositing structures differing therefrom may also be employed. The thickness of each of the layers shown in the drawings is not an actual value, but a conceptual value.

First Embodiment

1. Semiconductor Light-Emitting Device

FIG. 1 is a schematic view of the structure of a light-emitting device 100 of the present embodiment. The light-emitting device 100 is a flip-chip type semiconductor light-emitting device. Therefore, a light is extracted in a direction of arrow L. The emission wavelength of the light-emitting device 100 is approximately 400 nm to 500 nm. As shown in FIG. 1, the light-emitting device 100 comprises a substrate 110, an n-type semiconductor layer 120, a light-emitting layer 130, a p-type semiconductor layer 140, a transparent electrode TE1, a transparent insulating film TI1, a reflection electrode P1, a cover electrode P2, a p-pad electrode PE, an n-dot electrode N1, an n-wiring electrode N2, an n-pad electrode NE, and an insulating layer I.

The n-type semiconductor layer 120 is a first conduction type first semiconductor layer having an n-type contact layer, an n-side electrostatic breakdown preventing layer, and an n-side superlattice layer. The p-type semiconductor layer 140 is a second conduction type second semiconductor layer having a p-type cladding layer and a p-type contact layer. The light-emitting layer 130 is a semiconductor layer disposed between the n-type semiconductor layer 120 and the p-type semiconductor layer 140. The light-emitting layer 130 is a layer for emitting light through recombination of holes and electrons. These semiconductor layers are a Group III nitride semiconductor layer.

The substrate 110 is, for example, a sapphire substrate. Other commonly used substrate may also be employed. A light extraction surface 110a of the substrate 110 preferably has irregularities to improve light extraction efficiency. Moreover, a surface opposite to the light extraction surface 110a of the substrate 110 preferably has irregularities.

The transparent electrode TE1 is an electrode for establishing ohmic contact with a p-type contact layer of the p-type semiconductor layer 140. The transparent electrode TE1 is formed on the p-type contact layer of the p-type semiconductor layer 140. The transparent electrode TE1 is made of IZO.

The transparent insulating film TI1 is a single transparent insulating film. The transparent insulating film TI1 is formed on a part of a first surface TE1a of the transparent electrode TE1. The transparent insulating film TI1 covers a part of the transparent electrode TE1. The transparent insulating film TI1 has a plurality of openings TI1x. The transparent insulating film TI1 is made of $SiO_2$.

The reflection electrode P1 is an electrode for supplying current to the second semiconductor layer being in contact with the transparent electrode TE1. The reflection electrode P1 serves as a reflecting layer for reflecting light from the light-emitting layer 130 and as a p-electrode for supplying electric power to the semiconductor layer. The reflection electrode P1 is formed on the remaining part, i.e., exposed portion, not covered with the transparent insulating film TI1 of the first surface TE1a of the transparent electrode TE1 and on a part pf the transparent insulating film TI1. The reflection electrode P1 is in contact with the transparent electrode TE1 at the openings TI1x. The reflection electrode P1 is a layer of, for example, a-IZO and Ag alloy deposited in this order on the transparent electrode TE1 and the transparent insulating film TI1. The a-IZO means amorphous IZO. Thus, the reflection electrode P1 comprises an a-IZO film P11 and a reflective metal layer P12 formed on the a-IZO film P11. The a-IZO film P11 is in contact with the IZO of the transparent electrode TE1 through the opening TI1x and the transparent insulating film TI1. The reflective metal layer P12 is in contact with the a-IZO film P11. The a-IZO film P11 functions as an adhesive layer for strongly adhering Ag alloy of the reflective metal layer P12 to the transparent insulating film TI1. The Ag alloy is hardly adhered to the transparent insulating film TI1 because Ag is little oxidized. However the Ag alloy of the reflective metal layer P12 is strongly fixed on the transparent insulating film TI1 and the transparent electrode TE1 because the a-IZO film P11 exists as an adhesive layer between the Ag alloy and the transparent insulating film TI1 and between the Ag alloy and the transparent electrode TE1. And the Ag alloy of the reflective metal layer P12 can electrically much contact with the IZO of the transparent electrode because the a-IZO film P11 is transparent and conductive. When the reflective metal layer P12 is well adhered to the transparent insulating film TI1, the a-IZO film P11 may not be necessary. The thickness of the a-IZO film P11 is preferably within a range of 0.5 nm to 10 nm, more preferably of 1 nm to 5 nm. Though the reflective metal layer P12 comprises Ag alloy, other metal may be used as the reflective metal layer P12. The reflective metal layer P12 may have a plurality of metal layers, e.g., Ag and Ta or Ag alloy and Ta. The thickness of the reflective metal layer P12 is preferably within a range of 100 nm to 500 nm. The reflection electrode P1 is disposed at a position far from the transparent electrode TE1 on a side opposite to the substrate 110 when viewed from the light-emitting layer 130.

The cover electrode P2 is an electrode for the second conduction type semiconductor layer. The cover electrode P2 is formed on the reflection electrode P1. The cover electrode P2 is, for example, a layer in which Ti, Pt, Au, and Ta are deposited in this order on the reflection electrode P1. Needless to say, other materials may be used.

The p-pad electrode PE is an electrode for the second conduction type semiconductor layer. The p-pad electrode PE is formed on the cover electrode P2. The p-pad electrode PE is, for example, a layer in which Ti, Pt, and Au are deposited in this order on the cover electrode P2. Needless to say, other materials may be used.

The n-dot electrode N1 is an electrode for the first conduction type semiconductor layer being in contact with an n-type contact layer of the n-type semiconductor layer 120. The n-dot electrode N1 is formed on the n-type semiconductor layer 120. The n-dot electrode N1 is, for example, a layer in which Ti, Al alloy, and Ta are deposited in this order on the n-type semiconductor layer 120. Alternatively, Ni, Cr, Ag, and Rh or alloy containing these may be used. Needless to say, other materials may be used.

The n-wiring electrode N2 is an electrode for the first conduction type semiconductor layer. The n-wiring electrode N2 is formed on the n-dot electrode N1. The n-wiring electrode N2 is, for example, a layer in which Ti, Pt, Au, and Ta are deposited in this order on the n-dot electrode N1. Needless to say, other materials may be used.

The n-pad electrode NE is an electrode for the first conduction type semiconductor layer. The n-pad electrode NE is formed on the n-wiring electrode N2. The n-pad electrode NE is, for example, a layer in which Ti, Pt, and Au are deposited in this order on the n-wiring electrode N2. Needless to say, other materials may be used.

The insulating layer I is a layer for insulating the electrode for the first conduction type semiconductor layer from the electrode for the second conduction type semiconductor layer. The insulating layer I is formed of, for example, $SiO_2$.

2. Structure in the Vicinity of Reflection Electrode

As mentioned above, the transparent electrode TE1 is formed on the p-type semiconductor layer 140. The reflection electrode P1 is formed on the remaining part, i.e., exposed portions (the openings TI1x), of the first surface TE1a of the transparent electrode TE1 and the transparent insulating film TI1. The reflection electrode P1 covers the remaining part of the first surface TE1a of the transparent electrode TE1 and a part of the transparent insulating film TI1. The second surface TE1b of the transparent electrode TE1 is in contact with the p-type semiconductor layer 140.

As shown in FIG. 1, the transparent insulating film TI1 is formed on a part of the first surface TE1a of the transparent electrode TE1. The transparent insulating film TI1 has a plurality of openings TI1x. The opening TI1x is a through hole penetrating the transparent insulating film TI1.

The reflection electrode P1 has a plurality of contact electrodes P1a. The contact electrodes P1a are distributedly arranged in the light-emitting surface. The contact electrodes P1a are in contact with the transparent electrode TE1 at the openings TI1x. Therefore, the reflection electrode P1 is conducted with the transparent electrode TE1.

Figure 2:
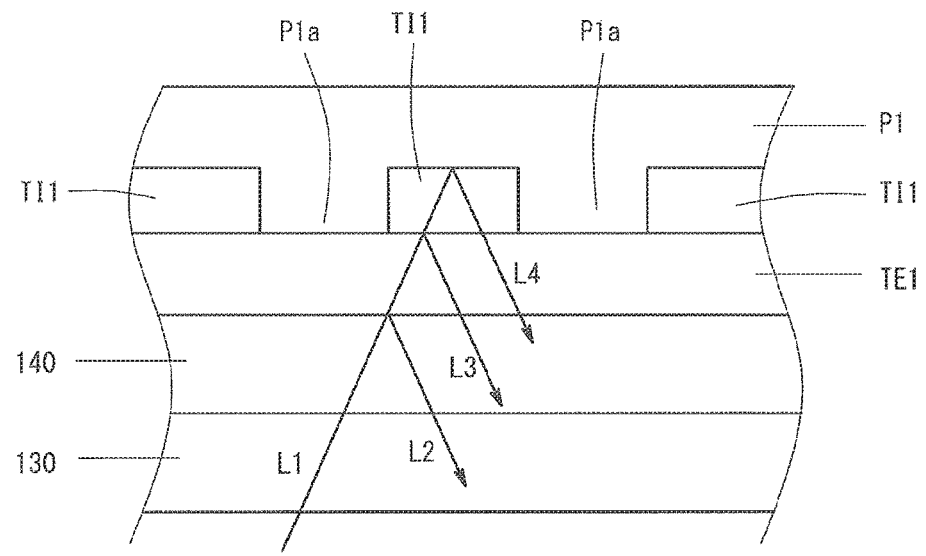
FIG. 2 is a view illustrating how a light traveling toward a reflection electrode is reflected at an interface between materials.

As shown in FIG. 2, a reflective light of light L1 traveling toward the reflection electrode P1 comprises a component L2 reflected at an interface between the p-type semiconductor layer 140 and the transparent electrode TE1, a component L3 reflected at an interface between the transparent electrode TE1 and the transparent insulating film TI1, a component L4 reflected at an interface between the transparent insulating film TI1 and the reflection electrode P1.

The ratio of the area occupied by the remaining part, i.e., exposed portion, not covered with the insulating film TI1, to the total surface area of the transparent electrode TE1, that is, the ratio of the total area occupied by the openings TI1x of the transparent insulating film TI1 to the total surface area of the transparent electrode TE1, is preferably 1% to 5%.

3. Film Formation Method of Transparent Electrode and Reflection Electrode

The transparent electrode TE1 includes IZO. The reflection electrode P1 includes a-IZO film P11. The a-IZO film P11 is formed on the IZO film of the transparent electrode TE1 and the transparent insulating film TI1. The method for forming the IZO film of the transparent electrode TE1 and the a-IZO film P11 is described below. The IZO and a-IZO films are formed by sputtering. Also, the transparent insulating film TI1 is formed by sputtering. Just after film formation, IZO is amorphous state, i.e., a-IZO. Here, a-IZO becomes crystalline IZO by applying heat treatment to the a-IZO. The heat treatment temperature is, for example, approximately 300° C. The heat treatment time is, for example, about one hour. Next, $SiO_2$ film of the transparent insulating film TI1 is formed on the crystalline IZO of the transparent electrode TE1 by sputtering $SiO_2$. The transparent insulating film TI1 is etched in a predetermined pattern to make the plurality of openings TI1x. Subsequently, a-IZO film P11 of the reflection electrode P1 is formed on the transparent insulating film TI1 and the crystalline IZO of the transparent electrode TE1 of the plurality of openings TI1x by sputtering IZO. The heat treatment is not performed. Accordingly, the a-IZO film P11 maintains amorphous state. That is, the IZO film of the transparent electrode TE1 is a layer heat treated, and the a-IZO film P11 of the reflection electrode P1 is a layer not heat treated.

4. Thickness of Transparent Electrode

The transparent electrode TE1 is an electrode transmitting light while diffusing current. However, the transparent electrode TE1 does not completely transmit light but slightly absorbs light. Therefore, when the thickness of the transparent electrode TE1 is large, the optical path of the light passing through the transparent electrode TE1 is long. In other words, when the thickness of the transparent electrode TE1 is larger, current can be more sufficiently diffused, but the transparent electrode TE1 absorbs more amount of light. On the contrary, when the thickness of the transparent electrode TE1 is smaller, the optical path of the light passing through the transparent electrode TE1 is shorter. That is, when the thickness of the transparent electrode TE1 is smaller, light absorption by the transparent electrode TE1 can be more suppressed, but current diffusion is less sufficient.

Therefore, in the present embodiment, the thickness of the transparent electrode TE1 is 10 nm to 150 nm. However, the thickness of the transparent electrode TE1 is also related to the number density of the contact electrodes P1a described later.

5. Number Density of Contact Electrodes

Figure 3:
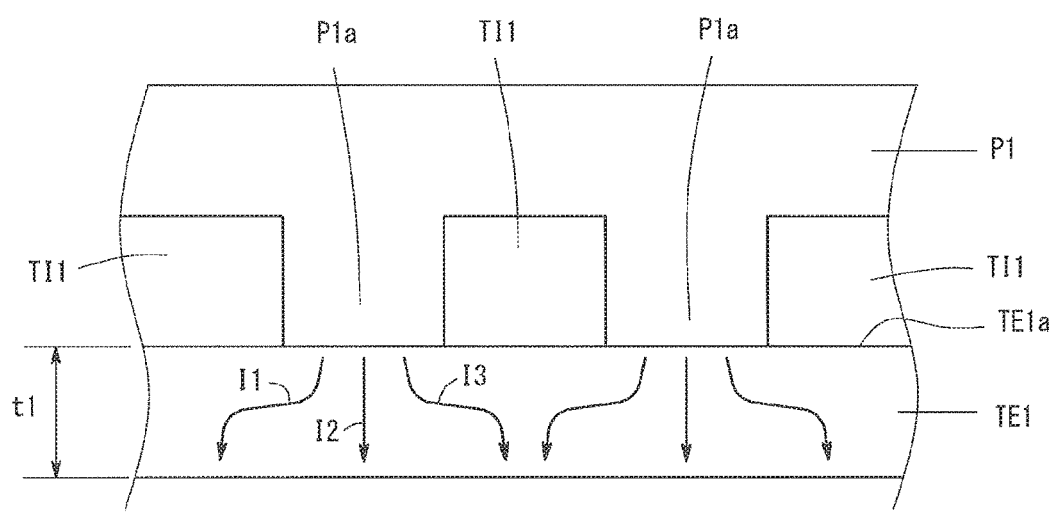
FIG. 3 is a view schematically illustrating current flowing in the transparent electrode.

FIG. 3 is a view schematically illustrating current flowing in the transparent electrode TE1. As shown in FIG. 3, current injected from the contact electrodes P1a is diffused in the transparent electrode TE1. FIG. 3 schematically illustrates diffusion current I1, I2, and I3. Whether current is sufficiently diffused in the transparent electrode TE1 depends on the thickness t1 of the transparent electrode TE1 and the number density of the contact electrodes P1a.

In the present embodiment, the thickness of the transparent electrode TE1 is designed to be smaller under the condition that diffusion current I1, I2, and I3 are sufficiently diffused in the transparent electrode TE1. Thereby, current is sufficiently diffused to promote light emission in the light-emitting layer 130 and to suppress light absorption in the transparent electrode TE1.

The number density of the contact electrodes P1a is $400/mm^2$ to $1,000/mm^2$. The area in the denominator of the above number density is the area of the transparent electrode TE1. That is, the above number density is the number of the contact electrodes P1a existed per an unit area of the surface of the transparent electrode TE1. Not so many contact electrodes P1a are drawn in FIG. 1 and others because they are schematic views. However, the reflection electrode P1 actually has a large number of the contact electrode P1a. The thickness t1 of the transparent electrode and the number density of the contact electrodes P1a are summarized in Table 1.

TABLE 1

| Thickness of transparent electrode | 10 nm to 150 nm |
|---|---|
| Number density of contact electrodes | $400/mm^2$ to $1,000/mm^2$ |

6. Effect of the Present Embodiment

The light-emitting device 100 according to the present embodiment can sufficiently diffuse current to promote light emission in the light-emitting layer 130 and to suppress light absorption in the transparent electrode TE1.

7. Variation 7-1. Types of Semiconductor Layer

The semiconductor layer of the light-emitting device 100 according to the present embodiment is a Group III nitride semiconductor layer. However, other Group III-V semiconductors, Group IV semiconductor, and other semiconductor may be used as a semiconductor layer.

7-2. Transparent Insulating Film

The transparent insulating film TI1 of the present embodiment is a single insulating film. A multilayer insulating film may be used as a transparent insulating film TI1. A distributed Bragg reflection film (DBR) may be employed instead of the transparent insulating film TI1, for example, a DBR film in which $SiO_2$ and $TiO_2$ are alternately deposited. This DBR film can appropriately reflect the light from the light-emitting layer 130 to the light extraction surface 110a side.

7-3. Material of Transparent Electrode

The transparent electrode TE1 of the present embodiment is made of IZO. The transparent electrode TE1 may be made of transparent conductive oxide containing In such as ITO, ICO (Indium Cerium Oxide), IGO (Indium Gallium Oxide), ITZO (Indium Tin Zinc Oxide), and IGZO (Indium Gallium Zinc Oxide), instead of IZO.

8. Summary of the Present Embodiment

As described above in detail, the light-emitting device 100 has a transparent electrode TE1 with a thickness of 10 nm to 150 nm and a plurality of contact electrodes P1a with a number density of 400/mm$^2$ to 1,000/mm$^2$. Therefore, the light-emitting device 100 can sufficiently diffuse current to promote light emission in the light-emitting layer 130 and to suppress light absorption in the transparent electrode TE1. Thus, a bright light-emitting device 100 is achieved.

The above-described embodiment is merely an example. Accordingly, needless to say, the embodiment may be improved or modified in various ways without departing from the scope of the present invention. The deposition structure of the semiconductor layer is not necessarily limited to the above-illustrated structure.

EXAMPLES

Simulation performed for IZO and ITO and experiments performed for the light-emitting device will be described.

1. Simulation of Reflectivity with Respect to Thickness of Transparent Electrode 1-1. Simulation Simulation performed for IZO and ITO is described below. In this simulation, the reflectivity of a light incident from the transparent electrode TE1 was calculated in a system where a transparent insulating film TI1 having openings TI1x and a reflection electrode P1 are formed on the transparent electrode TE1 as shown in FIG. 1. The transparent electrode TE1 was made of IZO or ITO. The thickness of the transparent electrode TE1 was any one of 200 nm, 150 nm, and 100 nm. The transparent insulating film TI1 was a distributed Bragg reflection (DBR) film made of $SiO_2$ and $Nb_2O_5$. The number density of the openings, i.e., the number density of the contact electrodes, was 481/mm$^2$. The light wavelength was 450 nm.

1-2. Calculation Results

Figure 4:
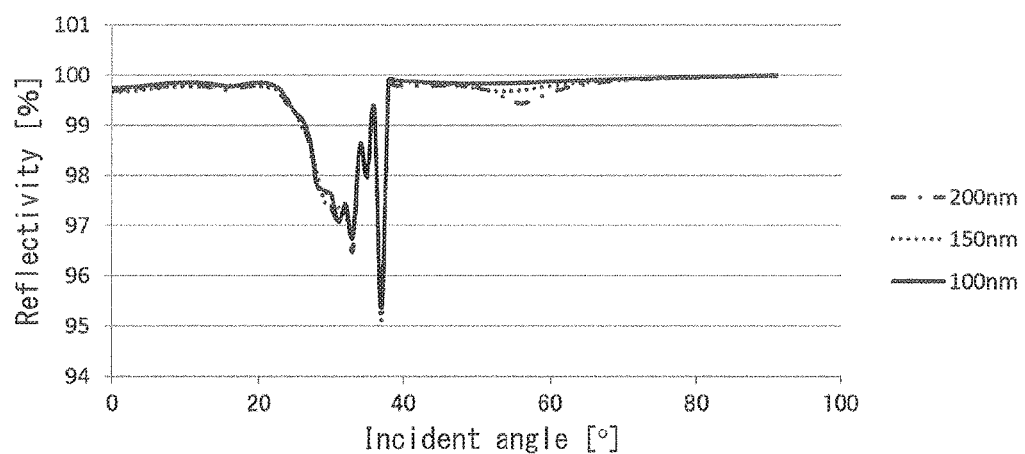
FIG. 4 is a graph showing the reflectivity of a light with a wavelength of 450 nm in case that the transparent electrode is made of IZO.

FIG. 4 is a graph showing the reflectivity of a light with a wavelength of 450 nm in case that the transparent electrode is made of IZO. The horizontal axis of FIG. 4 indicates the incident angle (°). The vertical axis of FIG. 4 indicates the reflectivity (%). A deviation from 100% shows the light absorptivity (%) by IZO. The reflectivity in a range of 40° to 90° of the incident angle is considered important to improve light output because much light with such incident angle is assumed to be generated in the light-emitting layer 130.

As shown in FIG. 4, when the incident angle is from 30° to 40°, a certain degree of light absorption occurs. When the incident angle is near 60° (around 55°), difference in reflectivity occurs according to difference in thickness.

Figure 5:
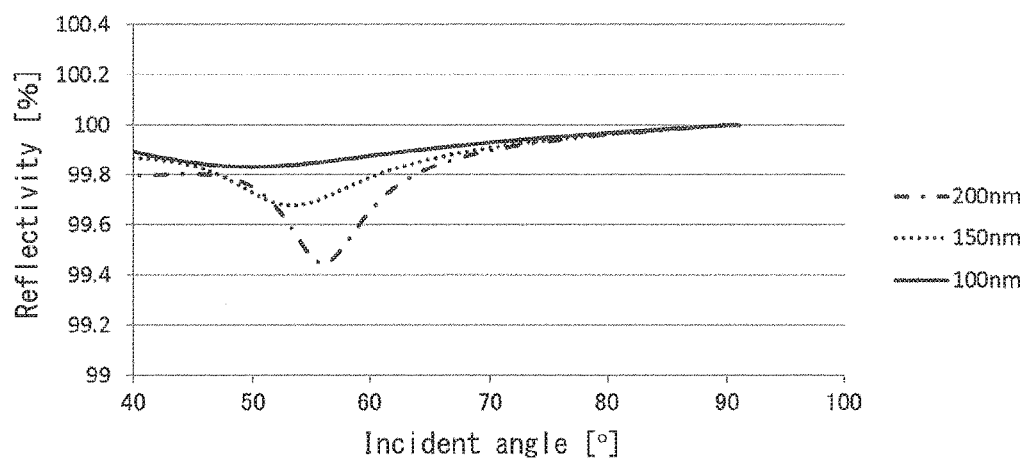
FIG. 5 is an enlarged view of FIG. 4.

FIG. 5 is an enlarged view of FIG. 4. As shown in FIG. 5, difference in the degree of light absorption is caused by the thickness when the incident angle is from 50° to 65°. When the incident angle is within a range of 50° to 65°, as shown in FIG. 5, light absorption is the smallest when the IZO film thickness is 100 nm. When the IZO film thickness is 150 nm, light absorption is the second largest. When the IZO film thickness is 200 nm, light absorption is the largest.

When the IZO film thickness is 100 nm, the reflectivity is not less than 99.8% within an incident angle range from 50° to 65°. Therefore, when the IZO film thickness is not more than 100 nm, light absorption by IZO is considered to be sufficiently suppressed.

When the incident angle is not less than 65°, light is hardly absorbed in any IZO film thicknesses.

Figure 6:
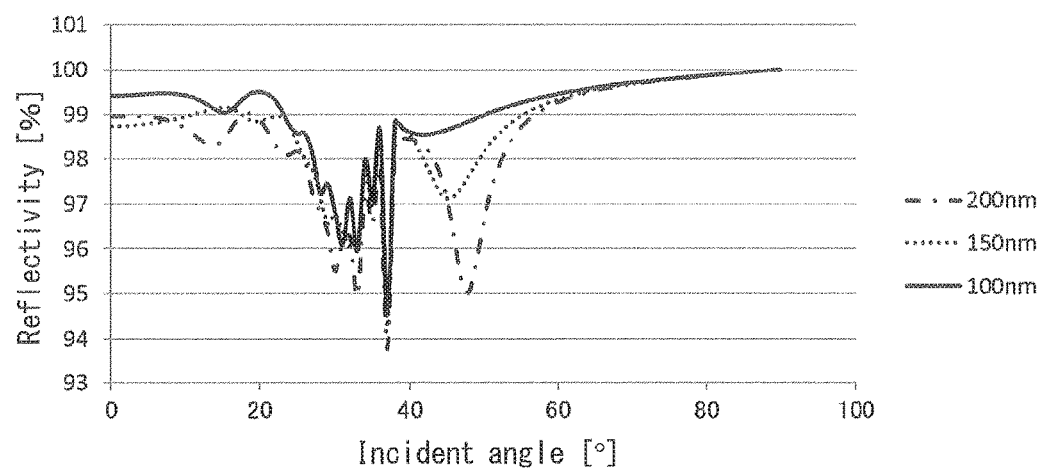
FIG. 6 is a graph showing the reflectivity of a light with a wavelength of 450 nm in case that the transparent electrode is made of ITO (Indium Tin Oxide)

FIG. 6 is a graph showing the reflectivity of a light with a wavelength of 450 nm in case that the transparent electrode is made of ITO. The horizontal axis of FIG. 6 indicates the incident angle (°). The vertical axis of FIG. 6 indicates the reflectivity (%). A deviation from 100% shows the light absorptivity (%) by ITO. The reflectivity in a range of 40° to 90° of the incident angle is considered important to improve light output because much light with such incident angle is assumed to be generated in the light-emitting layer 130.

As shown in FIG. 6, when the incident angle is from 30° to 40°, considerable light absorption occurs. In a range of incident angle from 30° to 40°, the light reflectivity tends to be higher as the film thickness is thinner.

When the incident angle is from 40° to 60°, considerable light absorption occurs. In a range of incident angle from 40° to 60°, as shown in FIG. 6, light absorption is the smallest when the ITO film thickness is 100 nm. When the ITO film thickness is 150 nm, light absorption tends to be the second largest. When the ITO film thickness is 200 nm, light absorption tends to be the largest. However, in a range of incident angle close to 40°, when the ITO film thickness is 150 nm, light absorption is the largest, and when the ITO film thickness is 200 nm, light absorption is the second largest.

When the ITO film thickness is 100 nm, the light reflectivity is not less than 98.5% within an incident angle range from 40° to 60°. Therefore, when the ITO film thickness is not more than 100 nm, light absorption by ITO is considered to be sufficiently suppressed.

When the incident angle is not less than 60°, light is hardly absorbed in any film thicknesses.

From the above, when the thickness of the transparent electrode containing In is not more than 100 nm, light absorption is considered to be sufficiently suppressed.

2. Experiments of Total Radiant Flux and Driving Voltage with Respect to Thickness of Transparent Electrode 2-1. Sample A light-emitting device of 1 mm×1 mm was produced as a sample. The total surface area of IZO is 0.89 mm$^2$. The total opening area of DBR is 0.02 mm$^2$. The ratio of the total area occupied by the opening of DBR to the total surface area of IZO is 2.7%. The number of contact electrodes is 486 per a chip. The number density of the contact electrodes is 545/mm$^2$.

2-2. Experiment Results

Figure 7:
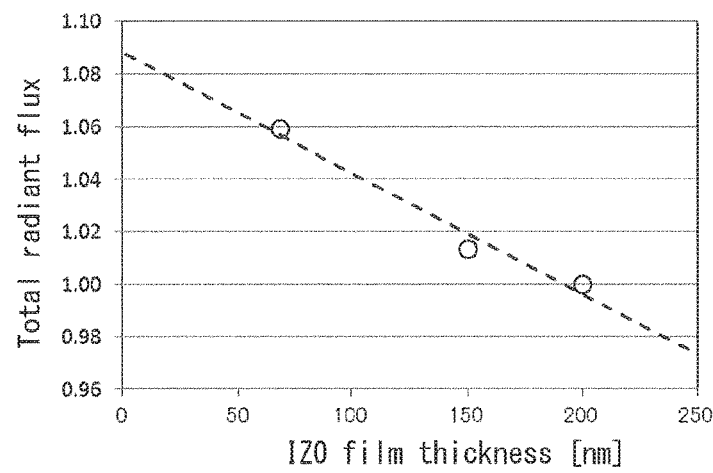
FIG. 7 is a graph showing the total radiant flux Po to the IZO film thickness.

FIG. 7 is a graph showing the total radiant flux Po to the IZO film thickness. The horizontal axis of FIG. 7 indicates the IZO film thickness (nm). The vertical axis of FIG. 7 indicates the total radiant flux Po normalized by the value at the IZO film thickness of 200 nm. That is, the total radiant flux when the IZO film thickness is 200 nm is set as 1. As shown in FIG. 7, the larger the IZO film thickness, the smaller the total radiant flux.

Therefore, when the IZO film thickness is not more than 150 nm, the total radiant flux is not less than 1.02. When the IZO film thickness is not more than 100 nm, the total radiant flux is not less than 1.04. Accordingly, the IZO film thickness is preferably not more than 150 nm, and more preferably, not more than 100 nm.

Figure 8:
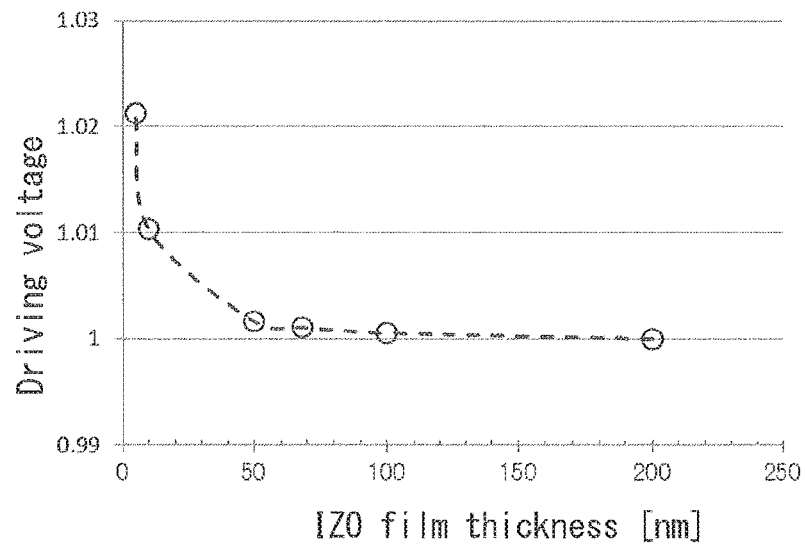
FIG. 8 is a graph showing the driving voltage Vf to the IZO film thickness.

FIG. 8 is a graph showing the driving voltage Vf to the IZO film thickness. The horizontal axis of FIG. 8 indicates the IZO film thickness (nm). The vertical axis of FIG. 8 indicates the driving voltage Vf normalized by the value at the IZO film thickness of 200 nm. That is, the driving voltage Vf when the IZO film thickness is 200 nm is set as 1. As shown in FIG. 8, when the IZO film thickness is not less than 50 nm, the driving voltage Vf is converged to almost 1.

When the IZO film thickness is 10 nm, the driving voltage Vf is 1.01. When the IZO film thickness is 5 nm, the driving voltage Vf is 1.02. Therefore, the IZO film thickness is preferably not less than 10 nm, and more preferably, not less than 50 nm.

3. Summary of Thickness of Transparent Electrode

From the above simulation and experiment results, the thickness of the transparent electrode is preferably 10 nm to 150 nm, and more preferably, 10 nm to 100 nm, and most preferably, 50 nm to 100 nm. The ratio of the total area occupied by the opening of DBR to the total surface area of IZO is preferably 1% to 5%. That is, the ratio of the total area occupied by the contact electrodes P1a to the total surface area of the transparent electrode TE1 is preferably 1% to 5%.

4. Experiments with Respect to Number Density of Contact Electrodes 4-1. Sample

The light-emitting devices with various number densities of contact electrodes were produced as samples. The structure except for the number density of electrodes is same as the structure of the light-emitting devices used in experiments with respect to thickness of transparent electrode. IZO having a film thickness of 100 nm was employed as a transparent electrode.

4-2. Experiment Results

Figure 9:
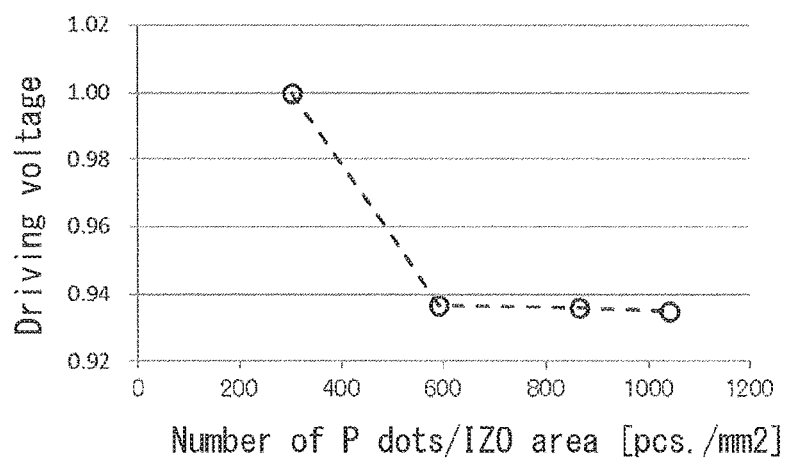
FIG. 9 is a graph showing the driving voltage Vf to the number density of contact electrodes.

FIG. 9 is a graph showing the driving voltage Vf to the number density of the contact electrodes. The horizontal axis of FIG. 9 indicates the number density of the contact electrodes (pcs./mm$^2$). The vertical axis of FIG. 9 indicates the driving voltage Vf normalized by the value at the number density of the contact electrodes of 300/mm$^2$. That is, the driving voltage Vf when the number density of the contact electrodes is 300/mm$^2$ is set as 1.

As shown in FIG. 9, the larger the number density of the contact electrodes, the smaller the driving voltage Vf. When the number density of the contact electrodes is not less than 600/mm$^2$, the driving voltage Vf is almost converged to a certain value. Therefore, the number density of the contact electrodes is preferably not less than 400/mm$^2$, and more preferably, not less than 600/mm$^2$.

Figure 10:
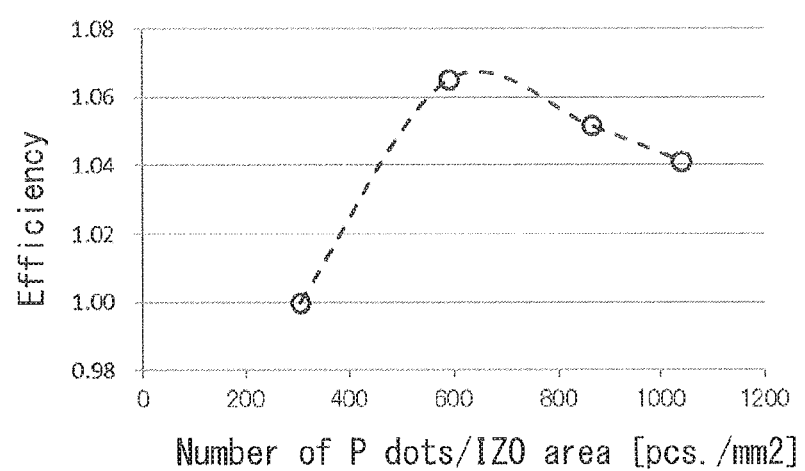
FIG. 10 is a graph showing the efficiency to the number density of contact electrodes.

FIG. 10 is a graph showing the efficiency to the number of contact electrode. The horizontal axis of FIG. 10 indicates the number density of the contact electrodes (pcs./mm$^2$). The vertical axis of FIG. 10 indicates the efficiency normalized by the value at the number density of the contact electrodes of 300/mm$^2$. That is, the efficiency when the number density of the contact electrodes is 300/mm$^2$ is set as 1.

As shown in FIG. 10, when the number density of the contact electrodes is 400/mm$^2$ to 1,000/mm$^2$, the efficiency is not less than 1.02. When the number density of the contact electrodes is 450/mm$^2$ to 1,000/mm$^2$, the efficiency is not less than 1.04. The number density of the contact electrodes is 550/mm$^2$ to 800/mm$^2$, the efficiency is not less than 1.06.

Therefore, the number density of the contact electrodes is preferably 400/mm$^2$ to 1,000/mm$^2$, and more preferably, 450/mm$^2$ to 1,000/mm$^2$, and most preferably, 550/mm$^2$ to 800/mm$^2$.

What is claimed is:

1. A semiconductor light-emitting device comprising:
a first conduction type first semiconductor layer;
a second conduction type second semiconductor layer;
a light-emitting layer disposed between the first semiconductor layer and the second semiconductor layer;
a transparent electrode on the second semiconductor layer;
an insulating film covering a part of the transparent electrode and having a plurality of openings; and
a reflection electrode formed on the insulating film and being in contact with the transparent electrode through the plurality of openings;
wherein the transparent electrode contains In;
the thickness of the transparent electrode is 10 nm to 150 nm;
the reflection electrode is an electrode for supplying current to the second semiconductor layer;
the reflection electrode has a plurality of contact electrodes being in contact with the transparent electrode at the plurality of openings; and
the number density of the contact electrodes is 400/mm$^2$ to 1,000/mm$^2$.

2. The semiconductor light-emitting device according to claim 1, wherein a ratio of a total area occupied by the plurality of contact electrodes to a total surface area of the transparent electrode 1% to 5%.

3. The semiconductor light-emitting device according to claim 1, wherein the insulating film is a distributed Bragg reflection film.

4. The semiconductor light-emitting device according to claim 1, wherein the reflection electrode comprises a transparent conductive film and a reflective metal layer formed on the transparent conductive film, the transparent conductive film being formed on the insulating film and being in contact with the transparent electrode through the plurality of openings.

5. The semiconductor light-emitting device according to claim 1, wherein the transparent electrode is an Indium Zinc Oxide (IZO) film.

6. The semiconductor light-emitting device according to claim 4, wherein the transparent electrode is an Indium Zinc Oxide (IZO) film and the transparent conductive film is an amorphous IZO (a-IZO) film.

7. The semiconductor light-emitting device according to claim 1, wherein the insulating film is transparent with respect to a light emitted from the light-emitting layer.

8. The semiconductor light-emitting device according to claim 1, wherein the number density of the contact electrodes is 450/mm$^2$ to 1,000/mm$^2$.

9. The semiconductor light-emitting device according to claim 1, wherein the number density of the contact electrodes is 550/mm$^2$ to 800/mm$^2$.

10. The semiconductor light-emitting device according to claim 1, wherein the thickness of the transparent electrode is 50 nm to 100 nm.

11. The semiconductor light-emitting device according to claim 9, wherein the thickness of the transparent electrode is 50 nm to 100 nm.

* * * * *